(12) United States Patent
Su et al.

(10) Patent No.: US 7,622,309 B2
(45) Date of Patent: Nov. 24, 2009

(54) MECHANICAL INTEGRITY EVALUATION OF LOW-K DEVICES WITH BUMP SHEAR

(75) Inventors: Peng Su, Austin, TX (US); Scott K. Pozder, Austin, TX (US); David G. Wontor, Allen, TX (US); Jie-Hua Zhao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 481 days.

(21) Appl. No.: 11/168,837

(22) Filed: Jun. 28, 2005

(65) Prior Publication Data
US 2006/0292711 A1 Dec. 28, 2006

(51) Int. Cl.
*H01L 21/66* (2006.01)
(52) U.S. Cl. .................... 438/14; 438/15; 438/106; 257/E21.521
(58) Field of Classification Search .......... 438/14, 438/15, 106, 612, 613; 257/E21.521
See application file for complete search history.

(56) References Cited

U.S. PATENT DOCUMENTS

| 5,503,286 | A | * | 4/1996 | Nye et al. ............... 216/13 |
| 6,028,357 | A |   | 2/2000 | Moriyama .............. 257/737 |
| 6,077,765 | A | * | 6/2000 | Naya ..................... 438/614 |
| 6,137,174 | A |   | 10/2000 | Chiang et al. .......... 257/734 |
| 6,413,878 | B1 |   | 7/2002 | Woolsey et al. ........ 438/754 |
| 6,436,300 | B2 |   | 8/2002 | Woolsey et al. ........ 216/13 |
| 2002/0050378 | A1 |   | 5/2002 | Chiang et al. .......... 174/52.1 |
| 2004/0020045 | A1 | * | 2/2004 | Hirano ................... 29/846 |
| 2004/0072387 | A1 | * | 4/2004 | Hong et al. ............. 438/108 |
| 2005/0082577 | A1 | * | 4/2005 | Usui ...................... 257/211 |
| 2005/0112794 | A1 | * | 5/2005 | Cole et al. .............. 438/106 |

OTHER PUBLICATIONS

K. Hess, et al., U.S. Appl. No. 11/033,009, filed Jan. 11, 2005, entitled "Integrated Circuit Having Structural Support for a Flip-Chip Interconnect Pad and Method Therefor,".

K. Chang, et al., "Improvements of Solder Ball Shear Strength of a Wafer-Level CSP Using a Novel Cu Stud Technology," IEEE Transactions on Components and Packaging Technologies, vol. 27, No. 2, Jun. 2004.

* cited by examiner

*Primary Examiner*—Michael Trinh
(74) *Attorney, Agent, or Firm*—Hamilton & Terrile, LLP; Michael Rocco Cannatti

(57) ABSTRACT

A bump shear test is disclosed for evaluating the mechanical integrity of low-k interconnect stacks in an integrated circuit which includes a die test structure (11) having a stiff structural component (501, 502) positioned above and affixed to a conductive metal pad (103) formed in a last metal layer (104). The die test structure (11) may also include a dedicated support structure (41) below the conductive metal pad which includes a predetermined pattern of metal lines formed in the interconnect layers (18, 22, 26). After mounting the integrated circuit in a test device, a shear knife (601) is positioned for lateral movement to cause the shear knife to contact the stiff structural component (501). Any damage to the die test structure caused by the lateral movement of the shear knife may be assessed to evaluate the mechanical integrity of the interconnect stack.

17 Claims, 6 Drawing Sheets

MECHANICAL INTEGRITY EVALUATION OF LOW-K DEVICES WITH BUMP SHEAR

BACKGROUND OF THE INVENTION

1. Field of the Invention

The present invention is directed in general to the field of semiconductor devices. In one aspect, the present invention relates to a test structure for testing integrated circuits.

2. Description of the Related Art

The use of conductive balls, such as solder balls, to make electrical connection to a bond pad is a known method to make electrical connection to electrical circuitry of a semiconductor die. Conductive ball packaging is one type of semiconductor packaging known in the industry as flip chip interconnection. As geometries in semiconductors continue to shrink in size due to improvements in the technology for making semiconductors, the sizes of bond pad regions have become smaller, resulting in increased stress to the bond pad structure when physical connection is made to the semiconductor die. Additional mechanical integrity problems are created by the interconnect structures used with the manufacturing smaller geometry semiconductors. For example, bond pad structures fabricated with copper interconnect metallization and low dielectric constant (low-k) dielectrics are susceptible to mechanical damage during the bonding process, due to the lower Young's modulus and lower fracture toughness of such materials. As a result, the underlying stack of metal and dielectric layers in such bond pad structures may mechanically fracture more easily or otherwise be subject to mismatch stresses (such as generated during die attach process).

To detect such device defects, a variety of techniques have been proposed for characterizing the properties and the integration capability of these films, such as nano-indentation and four-point bend delamination tests for mechanical and adhesion properties, and die pull tests and thermal cycling tests for characterizing the behavior of low-k films in a flip chip package. However, these tests have one or more drawbacks in failing to quickly and reliably provide feedback on the quality of the mechanical integration of the back end of the line (BEOL) structures.

Accordingly, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings, in which.

Figure 1:
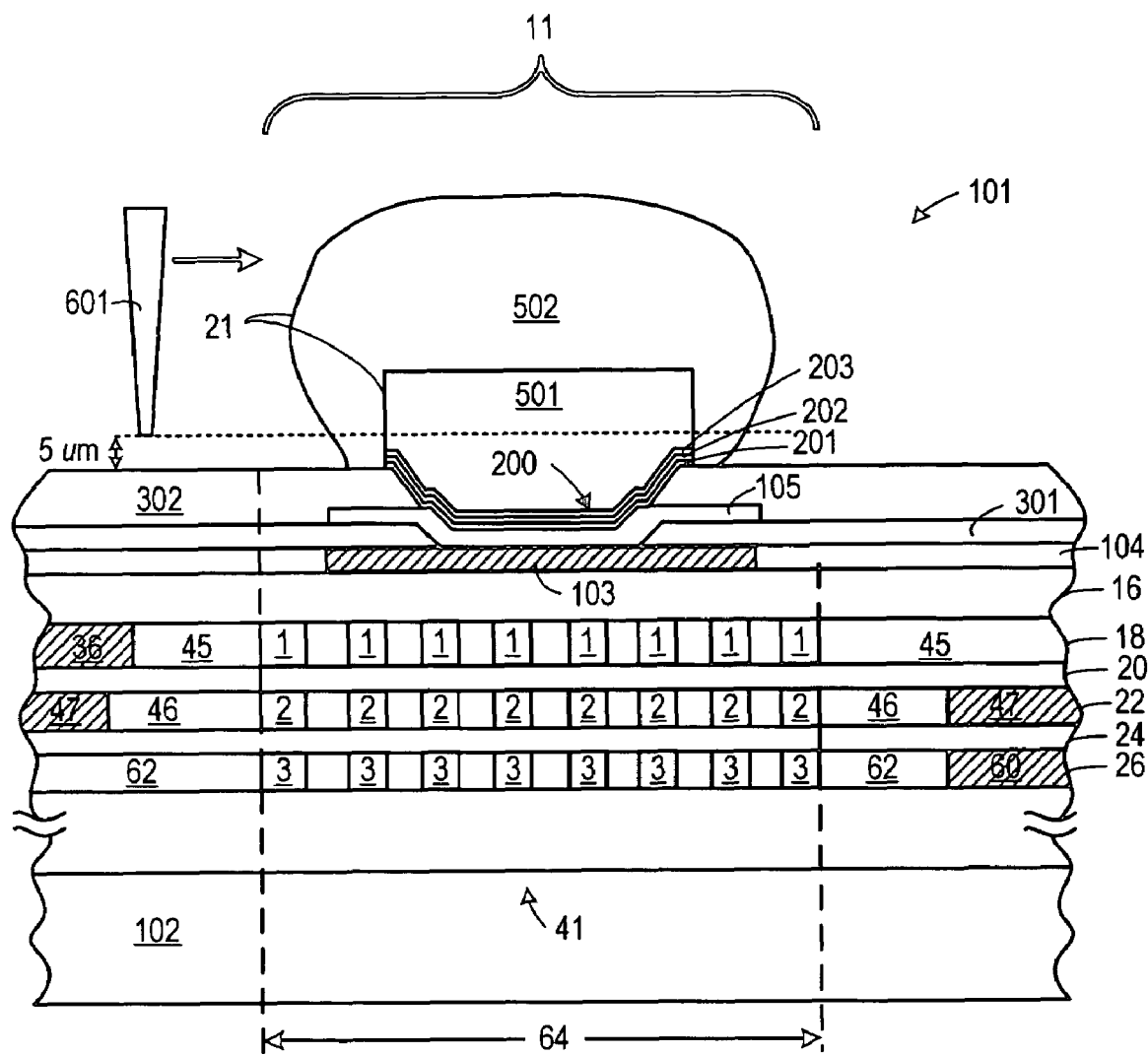
FIG. 1 illustrates in cross-sectional form a portion of an integrated circuit having a first exemplary die test structure with a support structure underlying a conductive bump in accordance with various embodiments of the present invention.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for effectively evaluating the integration quality of integrated circuits formed with low dielectric constant (low-k) materials before die packaging occurs, such as by using an improved bond pad structure as a mechanical test feature to provide location-specific integration quality data on one or more locations on a single die. Various details are set forth in the following description, but it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid obscuring the present invention. Such descriptions and representations are used by those skilled in the art to describe and convey the substance of their work to others skilled in the art. While various illustrative embodiments of the present invention will now be described in detail with reference to FIGS. 1-6, it is noted that the various layers of materials will be fabricated by selective deposition and/or removal steps. Where the specific procedures for depositing and removing such layers are not detailed below, conventional techniques known to those skilled in the art for depositing, removing, masking, etching or otherwise forming such layers at appropriate thicknesses may be used. Such details are well known and not considered necessary to teach one skilled in the art of how to make or use the present invention.

While the mechanical test procedures of the present invention may be used to evaluate the mechanical integrity of any integrated circuit structure, the procedures are especially useful for testing structures that are fabricated with low-k dielectrics. For example, low-k interconnect stacks are formed below a metal interconnect pad that is placed at the surface of an integrated circuit where an electrical connection is made from the pad to one or more underlying interconnect layers. In a typical integrated circuit design, multiple interconnect layers separated by interlayer dielectrics are formed in a stack to provide the required interconnections between devices in the semiconductor substrate. Examples of an interconnect pad include, but are not limited to, a wire bond pad, a probe pad, a flip-chip bump pad, a test point or other packaging or test pad structures that may require underlying structural support. Because the advanced low-k interlayer dielectrics used today have a lower dielectric constant and lower Young's modulus than dielectrics used in earlier generation products, integrated circuit structures may more easily mechanically fracture the underlying stack of metal and dielectric layers. As will be appreciated, a low modulus material is a material having a value typically less than sixty GPa (Giga-Pascals), and a low-k material is a material having a relative permittivity or dielectric constant typically less than four. It should be noted that many of the low-k dielectrics in use have low moduli. The use herein of a high modulus material is a material having a value typically equal to or greater than sixty GPa (Giga-Pascals). Dielectrics having any modulus value may be used in connection with the methods and structures described herein.

In a selected embodiment, the mechanical integrity of back end of the line (BEOL) structures (including but not limited to low-k structures) may be evaluated using an improved bump shear test. Under the test, a die test structure is provided that includes a rigid or stiff structural component, such as a bond pad structure which includes a solder bump with a tall stud (or the stud alone) as part of the under bump metallization (UBM). The die test structure is used, alone or in combination with a dedicated support structure formed with a predetermined layout pattern of metallization and dielectric in the interconnect stack underlying the pad, to form an improved mechanical test structure and methodology. By setting the parameters of the shear process (such as the shear knife speed, height, etc.) so that the shear knife is aimed at the rigid or stiff structural component that is effectively integrated with the underlying support structure, the bump shear test can provide detailed and accurate information about the integration robustness on almost any location on a die. Once the bump shear test procedures are calibrated, the load curve and maximum load recorded on the bump shear system may be analyzed to characterize the material properties of the low-k material and/or the quality of the BEOL integration. In addition, by using predetermined layout patterns in the metallization and dielectric stack underlying the pad, a uniform mechanical test structure may be formed in each die and in different wafers so that meaningful comparisons may be made of test results across different die and different wafers.

FIG. 1 illustrates in cross-sectional form a portion of an integrated circuit 100 having a first exemplary die test structure 11 that overlies a substrate 102. The substrate 102 may be formed of any material, and is typically a semiconductor such as silicon. Within substrate 102 may be formed one or more semiconductor devices (not shown). Overlying substrate 102 is a plurality of interconnect layer and interlayer dielectrics (ILDs). For example, a last interconnect or last metal (LM) layer 104 overlies a last ILD (LILD) or via layer 16. The last ILD 16 overlies a next-to-last (LM-1) interconnect or metal line layer 18. The next-to-last interconnect layer 18 overlies a next-to-last ILD (LILD-1) or via layer 20. The next-to-last ILD 20 overlies a second-from-last (LM-2) interconnect layer 22. The second-from-last interconnect layer 22 overlies a second-from-last ILD (LILD-2) or via layer 24. The second-from-last ILD 24 overlies a third-from-last (LM-3) interconnect layer 26, and so on.

The die test structure 11 embodiment depicted in FIG. 1 includes a test bump structure 21 which may be formed during fabrication of any conductive bump contacts for the integrated circuit. An example of such a fabrication process is described in U.S. Pat. No. 6,413,878 to Woolsey et al. (which is incorporated herein by reference in its entirety), although additional processing steps are required to form the metal cap layer 105 described below. The depicted test bump structure 21 includes a rigid or stiff structural component 501 (such as a stud formed of copper, tantalum, tungsten, chromium or the like) and a conductive solder ball 502 (such as tin (Sn) and lead (Pb) solder). Alternatively and as described below, the test bump structure may be formed of a rigid or stiff structural component (e.g., copper stud only), or alternatively may be formed of only a rigid or stiff conductive solder ball (such as formed with lead-free solder or other high modulus material(s)). The test bump structure is integrally attached to the underlying structure, such as by being positioned over and in contact with an optional under bump metallization layer(s) 200, metal cap 105 or conductive bond pad in the last metal line layer 103.

In the illustrated embodiment, the conductive solder ball 502 is solder but may be other electrically conductive materials, including various metal alloys. Layer 501 may be formed of a high modulus material, such as copper. Layer 105 may also be optionally provided as a metal cap layer comprised of aluminum (Al) or an alloy thereof, copper (Cu) or an alloy thereof, or a composite of a thin aluminum layer formed on a thinner tantalum layer. Layer 103 (in the last metal layer) may be optionally provided as a conductive bond pad formed of aluminum (Al), copper (Cu), or the like. However, it should be well understood that various metals may be used with the structure described herein.

As for the under bump metallization layer 200, various metal layers or composite metal layers may be used, including but not limited to a sputtered and electroplated copper layer formed over a sputtered titanium tungsten (TiW) layer, a NiAu bump layer, a Cr/CrCu bump layer, or the like. For example, the under bump metallization layer 200 may be optionally provided as a composite metal layer comprising a metal layer 201 (disposed to contact the exposed portion of layer 105), a metal layer 202 (disposed or deposited over layer 201), and a metal layer 203 (disposed or deposited over layer 202). Layers 201 and 202 may serve as barrier layers, and layer 203 may serve as a seed layer for a subsequent plating step. All of layers 201, 202, and 203 can be sequentially sputtered in-situ to thicknesses of approximately seventy nanometers (nm), approximately two hundred nm, and approximately five hundred nm, respectively. As an example, layer 201 may be formed of a thin layer of titanium tungsten (TiW), layer 202 may be formed of a thin layer of copper and layer 203 may be formed of a solderable metal comprised of copper. For example, a first layer 201 of TiW is sputtered to a first thickness (e.g., 230 nm), then a second layer 202 of Cu is applied to a second thickness (e.g., 530 nm). Next, a layer of photoresist is applied at a third thickness (30 um), is patterned to form an opening (e.g., with dimensions of 75 um by 80 um), and a layer of copper is plated to a fourth thickness (e.g., 18 um).

Insulating layers adjacent to the test bump structure 21 are used for passivation of the underlying metal in the last interconnect layer 104. For example, a passivation layer 301 may be formed by depositing $Si_3N_4$ or SiON over selected portions of the dielectric (e.g., TEOS) in the last interconnect layer 104 and the bonding pad 103, and then forming an opening or hole in the passivation layer 301 through which electrical and physical contact may be made with the bonding pad 103 (such as by using a metal cap layer 105). An additional passivation layer 302 may optionally be formed of a polyimide layer (to provide a stress buffer) or other passivation materials (such as $Si_3N_4$ or SiON) over selected portions of the first passivation layer 301 and metal cap layer 105, thereby forming an opening or hole through which the under bump metallization layer 200 makes electrical and physical contact with the metal cap layer 105.

The test bump structures described thus far may be placed at any interconnect pad site including active circuit contact pads or specially designated test pad locations. The test bump structures described herein provide an advantage over conventional bump shear tests which apply a shear pin or knife to conventional solder balls which are formed of soft tin/lead solder material. Using a stiff bump/stud shear test provides more accurate information about the underlying integration and can be done on any designated location on the die. Also, a stiff bump/stud can apply higher a stress distribution in the BEOL layers on the die than any other test method.

Figure 2:
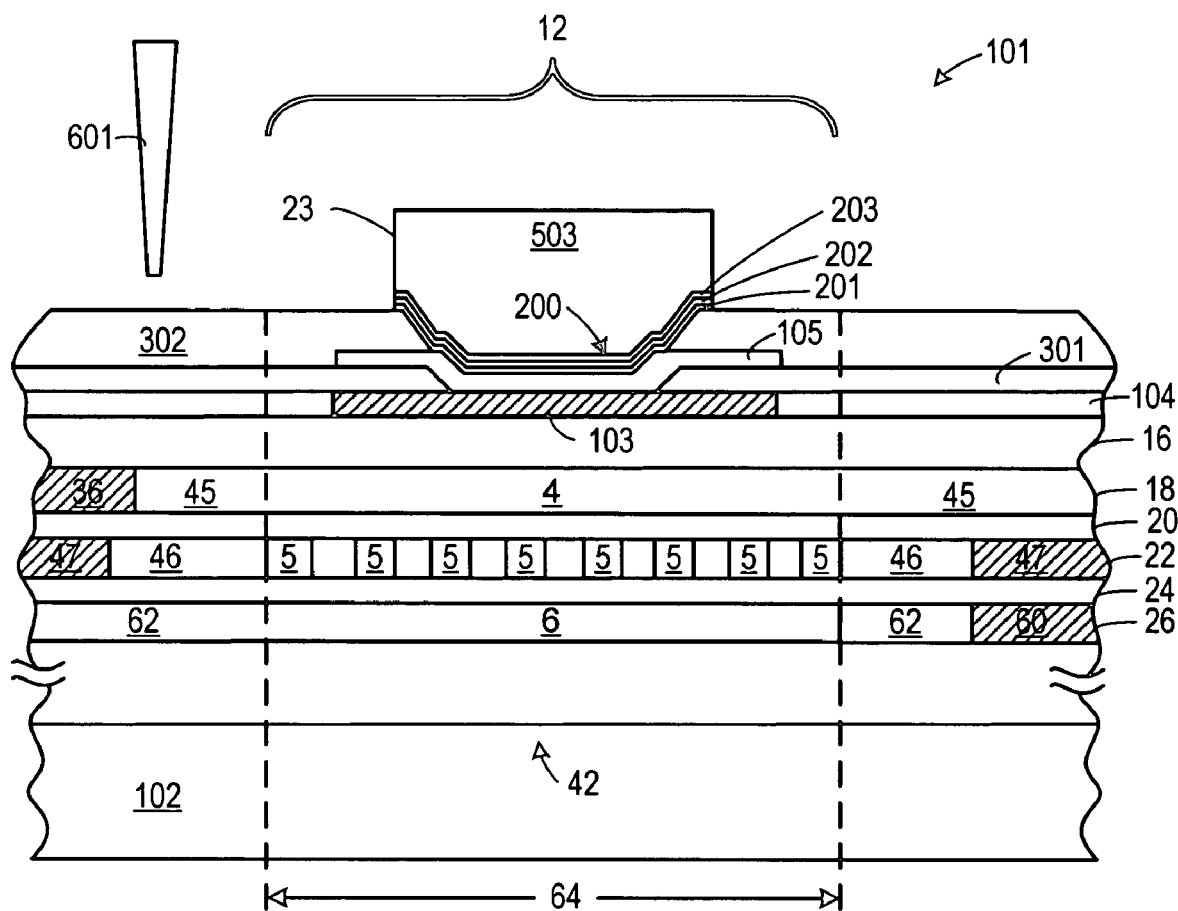
FIG. 2 illustrates in cross-sectional form a portion of an integrated circuit having a second exemplary die test structure with a support structure underlying a conductive bump in accordance with various embodiments of the present invention.
Figure 3:
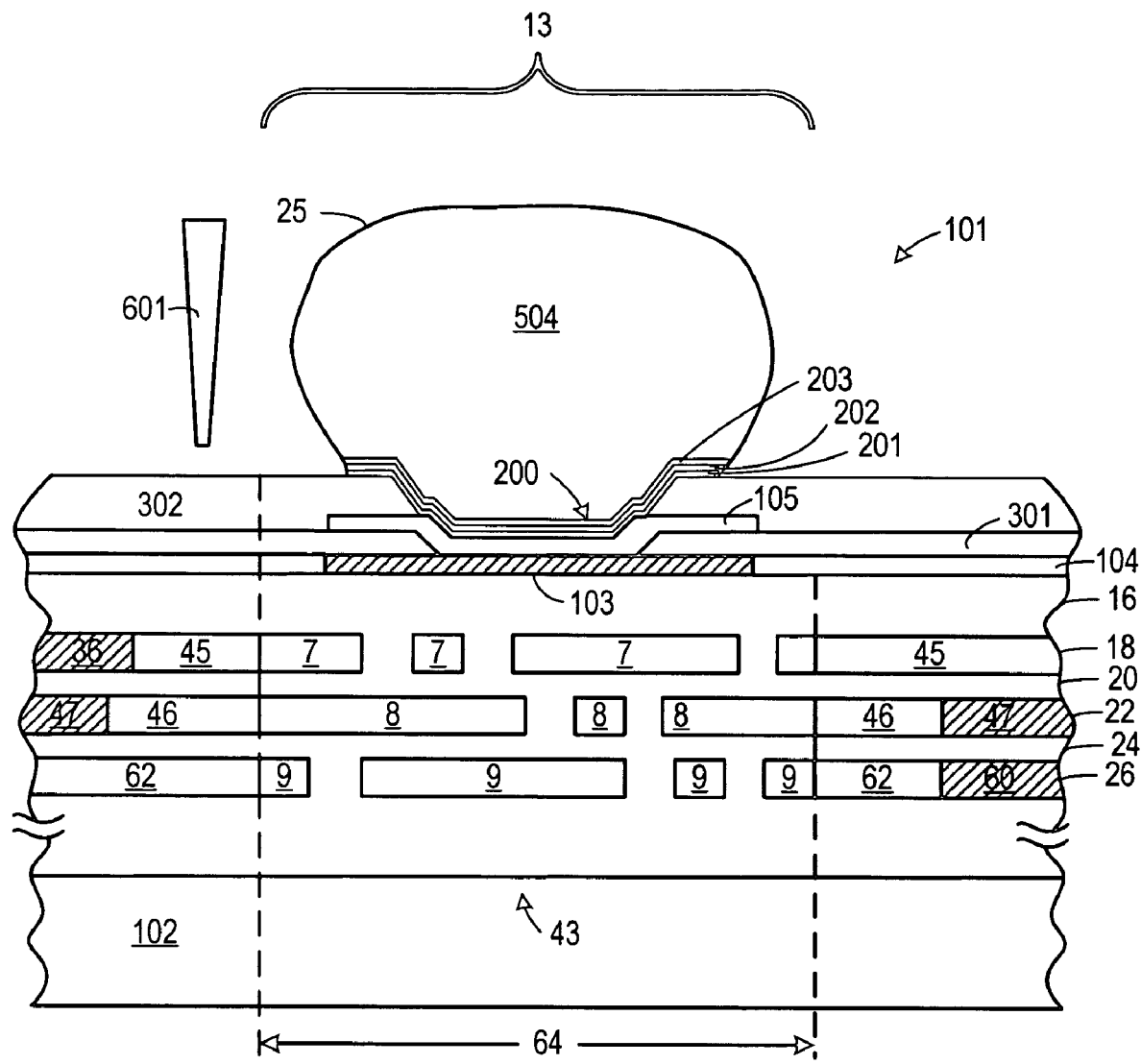
FIG. 3 illustrates in cross-sectional form a portion of an integrated circuit having a third exemplary die test structure with a support structure underlying a conductive bump in accordance with various embodiments of the present invention.

While bump shear testing may be improved by using a stiff bump/stud shear test structure, test bump structures fabricated with copper interconnect metallization and low dielectric constant (low-k) dielectrics are susceptible to differing rates of mechanical fracture that result from the use of low-k interlayer dielectrics that have a lower Young's modulus and lower fracture toughness. The metal density within the area defined by 64 can be different from the area outside of 64. In particular, it will be appreciated that the metal line density of a typical integrated circuit (such as that exemplified by the structure outside of the support structure region 64) varies randomly, depending on the circuit design layout. Density variations are depicted in FIGS. 1-3 in the part of the integrated circuit that is outside of support structure region 64, where the last interconnect layer 104 has a first metal line density defined with reference to the conductive bond pad 103, the LM-1 interconnect layer 18 has a second metal line density defined with reference to the metal line 36, the LM-2 interconnect layer 22 has a third metal line density defined with reference to the metal lines 47, and the LM-3 interconnect layer 26 has a fourth metal line density defined with reference to the metal line 60. In addition to the variation in metal line density from one interconnect layer to another, the metal line density will also vary laterally from one part of an integrated circuit to another. When such metal density variations exist underneath the test bump structures, it can be difficult to obtain any benchmark reading of the stack strength. For example, if shear test measurements are conducted on first and second test pad structures that have respective first and second metal densities, it can not be determined if any difference in the test results is caused by the differing metal densities (higher densities tend to be stronger) or by some other defect in the fabrication process.

Accordingly, selected embodiments of the present invention provide an improved bump shear test by including a dedicated support structure 41 as part of (or below) the test structure 21, thereby improving the overall toughness and strength of a die test structure 11 formed over a low-k stack. By providing each wafer or wafer die with test bump structure that includes a dedicated support structure 41 having a predetermined metal density or amount of metal present in the interconnect layers below the test bump structure 21, bump shear testing on the different wafers or wafer die can be used to meaningfully compare and evaluate the different wafers or wafer die. As will be appreciated, the predetermined metal density may be determined with reference to the amount of metal in the interconnect layers 18, 22, 26, but may also take into account the amount of metal or other via materials in the via layers 16, 20, 24. In addition to evaluating mechanical integrity, shear strength tests can also be used to differentiate high yielding die from low yielding die, as well as edge die versus center die, or failing die versus passing die.

FIG. 1 depicts a first example embodiment of the dedicated support structure 41 formed in a support structure region 64 with a predetermined pattern of metal layers 1, 2, 3 in one or more of the interconnect layers 18, 22, 26. As depicted, each interconnect layer 18, 22, 26 includes a parallel-type pattern of metal lines, such as metal lines 1 in the LM-1 layer 18, metal lines 2 in the LM-2 layer 22, and metal lines 3 in the LM-3 layer 26. In the embodiment shown, each interconnect layer 18, 22, 26 includes dielectric layers 45, 46, 62 that electrically isolate and separate the metal lines 1, 2, 4. By increasing the metal line density of the pattern of metal layers 1, 2, 3 in the interconnect layers 18, 22, 26, the overall strength and toughness of the die test structure 11 may be improved. For example, the die test structure 11 may be strengthened with a forty percent metal-to-dielectric density in the support structure region 41. In another embodiment, the predetermined metal density is fifty-five percent. Generally, a range for the minimum metal density is from thirty-five percent to eighty percent, but it should be appreciated that values other than those within this range may adequately provide structural support depending upon the materials used and the layout of the metal lines. Because the parallel-type pattern of metal lines may be included in one or more interconnect layers, the dedicated support structure 41 may be formed to any desired depth in the integrated circuit 100.

As for the lateral extent of the support structure 41, a stress boundary 64 defines a force region spanning the portion of the integrated circuit directly underlying the conductive bond pad 103 and extending laterally a limited distance. The force region is a region within the integrated circuit 100 in which forces are exerted on the interconnect layers when a bump shear test is performed on the test bump structure 21. The stress boundary 64 defines where the stress from the bump shear test is determined to be at or about zero. While the shape and contour of the force region may be arbitrarily defined, depending upon device technology and geometries, in an exemplary embodiment involving a square conductive pad 103 having lateral dimensions of 75×75 microns, the stress boundary 64 defines a cubic force region having lateral dimensions of 140×140 microns centered about the conductive pad 103. Alternatively, the lateral area of the stress boundary 64 may be defined as a ratio of the pad area to the stress boundary area (e.g., Pad Area/Stress Boundary Area=0.287). The lateral extent of the stress boundary is advantageously used to locate the die test structure of the present invention on a wafer die so that any mechanical fracture resulting from a bump shear test does not impair the remaining circuit functionality.

Whatever the size of the force region, it will be appreciated that the predetermined pattern of metal layers 1, 2, 3 in the support structure 41 may require, in some embodiments, that the support structure 41 be mechanically, functionally and/or electrically independent of the remaining circuit. In various embodiments, the metal layers 1, 2, 3 in the interconnect layers 18, 22, 26 are electrically independent of the remaining circuitry or are electrically grounded. While this feature means that space on an integrated circuit is used for nonfunctioning interconnect layers, the resulting bump shear test benefits obtained from the improved die test structure 11 outweigh any drawback from having unused integrated circuit space.

An example will now be described of how the die test structure 11 may be used in a bump shear test. When the shear knife 601 is applied or moved laterally against the die test structure 11 so as to intersect with the stiff structural component of the die test structure (e.g., the stud 501), increased stress is translated into the die. This increases the likelihood of inducing fracture in the weak interface/film in the die, as compared to conventional bump shear tests, thereby providing a better test for the mechanical integrity of the underlying interconnect layers. For example, if a solder bump 502 is formed with an 18 μm Cu stud 501 attached to the UBM 200, a shear knife 601 applied at a height of 5 μm will apply its force directly through the Cu stud 501 and into the interconnect layers. In contrast, a shear knife that is applied at a height of 20 μm will bypass the Cu stud 501 and its force will primarily be applied to the softer solder ball 502. By providing a die test structure 11 with a stiff structural component (e.g., a copper stud or other material having a modulus meeting or exceeding substantially sixty GPa), a bump shear test that aims the shear knife at the stiff structural component will translate the stress from the shear knife into the die to cause inter- or intra-film fracture, thereby providing much meaningful information about the integration of the die interconnect stack.

By also including a structural support 41 formed from a predetermined pattern of metal lines in each die test structure 11, mechanical die integrity test results from one wafer may be meaningfully compared with mechanical die integrity test results from another wafer. This structural support 41 accomplishes two things to make this possible. First, the provision of a uniform structural support 41 in the interconnect layers fabricated with copper interconnect metallization and low modulus dielectrics allows a target or baseline level of metal density (e.g., 40%) and strength to be established in each die test structure. Second, when the die test structures in a plurality of wafers or wafer die formed with a shared, predetermined metal line pattern, an apples-to-apples comparison can be made on bump shear tests of the plurality of die test structures.

By positioning the height of the stiff structural component of any test bump (or stud) and the height of the shear knife for direct impact during bump shear testing, the overall toughness and adhesion of the low-k interconnect stack, as well as other qualitative measures of the integrated circuit, may be measured. In a selected embodiment, the stiff metal studs (with or without solder) should be at least 5 um tall to facilitate bump shear testing. By including a stiff structural bump component that is affixed to the UBM and by appropriately defining the metal density of the underlying support structure (e.g., at forty percent per metal layer), a passing bump shear test result should only cause the portion of the bump above the UBM to fail during the shear test. If any fracture below the UBM layer happens, then it indicates a low-k BEOL failure, which is considered as not a good die. Alternatively, if the bump shear test removes all or part of the solder ball (or stud) or the UBM and nothing more, then the test indicates that the die is a "good die."

In addition, by providing multiple die with the same test bump and support structure and then performing bump shear tests, the differences in maximum load and characteristics of the load curves may be used to evaluate and compare the multiple die in terms of mechanical integrity, yield and other qualitative measures. In particular, the disclosed bump shear test structure and methodology may be used to monitor the under pad low-k BEOL fracture toughness, the quality of adhesion in low-k interconnect layers, variations in dielectric material strength, integration and layout weaknesses, or processing defects that are not detectable during processing (such as uniformity of layer porosity). Thus, the disclosed test structure and method is ideal for packaging development and monitoring product quality, especially for devices with low-k dielectric materials that are sensitive to the variance in dielectric material properties AND the quality of the integration.

This makes it possible to provide rapid feedback to the die manufacturing facility without running time-consuming package tests and qualifications. Alternatively, the disclosed test structure and method can be used to evaluate non-low-k devices.

In addition to the die test structure and parallel-type support structure depicted in FIG. 1, it is contemplated that the present invention may be implemented with other embodiments. For example, FIG. 2 illustrates in cross-sectional form a portion of an integrated circuit having a second exemplary die test structure 12 with an orthogonal or perpendicular-type support structure 42 underlying a conductive stud 23 in accordance with various embodiments of the present invention. The die test structure 12 depicted in FIG. 2 includes a test bump structure 23 which may be formed, in some embodiments, during fabrication of any conductive bump contacts for the integrated circuit using the fabrication process substantially as described in U.S. Pat. No. 6,413,878 to Woolsey et al. (except for the formation of the solder bump). The depicted test bump structure 23 includes only a stiff structural component 503 (such as a copper stud), and does not include a conductive solder ball. The stiff structural component 503 is preferably formed of a material having a high modulus, and is integrally attached to the underlying structure, such as by being positioned over and in contact with an optional under bump metallization layer(s) 200, metal cap 105 or conductive bond pad 103. Alternatively, a lower modulus material may be used for the test bump structure 23 if the thickness to shear of the structural component 503 is increased. As for the orthogonal-type support structure 42, FIG. 2 shows that a predetermined pattern of metal layers 4, 5, 6 are formed in the support structure region 64 of one or more of the interconnect layers 18, 22, 26. As depicted, the LM-1 layer 18 includes one or more metal lines 4 aligned laterally, the LM-2 layer 22 includes one or more metal lines 5 aligned perpendicularly to the metal lines 4, and the LM-3 layer 26 includes one or more metal lines 6 aligned perpendicularly to the metal lines 5 and in parallel with the metal lines 4. Such an orthogonal-type pattern of metal lines 42 in the support structure region 64 is slightly stiffer than the parallel-type pattern, and provides a better approximation of the mechanical integrity of the remainder of the integrated circuit than is provided by the parallel-type pattern of metal lines.

Another embodiment of the present invention is illustrated in FIG. 3, which shows in cross-sectional form a portion of an integrated circuit having a third exemplary die test structure 13 with a random x-y type pattern support structure 43 underlying a conductive bump 25 in accordance with various embodiments of the present invention. The test bump structure 25 depicted in FIG. 3 may be formed, in some embodiments, during fabrication of any conductive bump contacts for the integrated circuit using the fabrication process substantially as described in U.S. Pat. No. 6,413,878 to Woolsey et al. (except for the formation of the copper stud). As formed in attachment to the optional under bump metallization layer(s) 200, metal cap 105 or conductive bond pad 103 (described above), the depicted test bump structure 25 includes a rigid solder ball component 504 formed from a high modulus material (such as lead-free solder), and does not include a stud. As for the random x-y type support structure 43, FIG. 3 shows that a predetermined pattern of metal layers 7, 8, 9 formed in the support structure region 64 may be a combination of orthogonal and parallel lines configured in a Cartesian or "Manhattan" configuration. As depicted, the LM-1 layer 18 includes one or more metal lines 7 aligned orthogonally with respect to each other, the LM-2 layer 22 includes one or more metal lines 8 aligned orthogonally with respect to each other, and the LM-3 layer 26 includes one or more metal lines 9 aligned orthogonally with respect to each other. As will be appreciated, a random x-y type pattern of metal lines 43 in the support structure region 64 more accurately approximates the mechanical integrity of the remainder of the integrated circuit than the parallel-type or orthogonal-type metal line patterns.

It will be appreciated that any combination of the test bump structures and predetermined support structures described herein may be use to obtain the advantages of the present invention. For example and with reference to FIG. 4, the test bump structure may be implemented with only a stiff stud 505, or with only a stiff solder ball 506, or with a combination of a stiff stud 505 and solder ball 506 (which may or may not be formed of a high modulus material). With any of these embodiments of the test bump structure, the support structure 44 (shown in blank box form) may be implemented with a parallel-type pattern of metal lines, an orthogonal-type pattern of metal lines, or a random x-y type pattern of metal lines. With upcoming technology advances, a totally random metal line pattern may be used for the support structure 44, including but not limited to non-orthogonal-type patterns whereby metal lines are arranged to cross interconnect layers at various angles. Indeed, the support structure 44 may include any predetermined layout pattern of metallization and dielectric 10 in the interconnect stack underlying the pad, where the pattern 10 is defined with reference to the metal pattern in the interconnect layers and/or the via pattern in the via layers.

Figure 4:
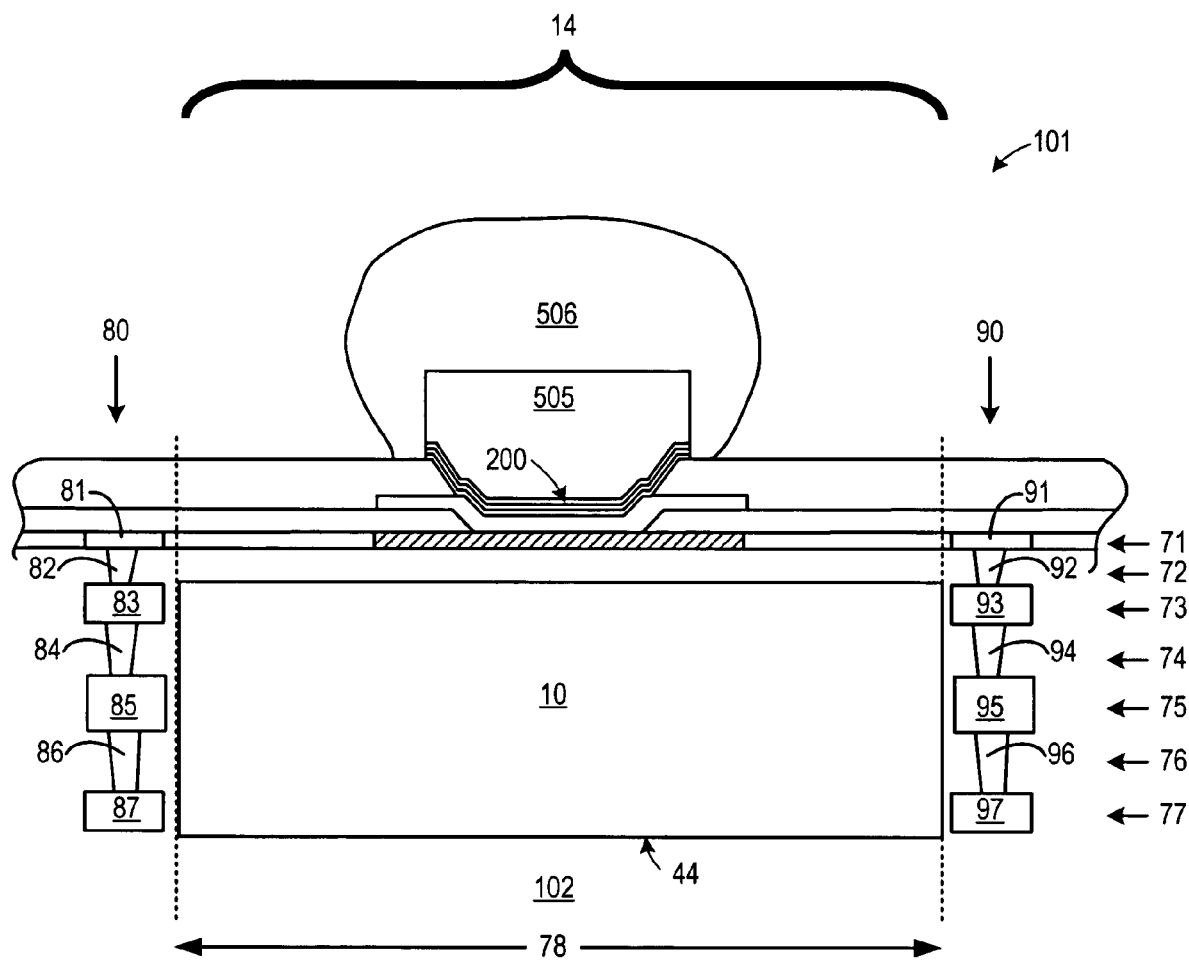
FIG. 4 illustrates in cross-sectional form a portion of an integrated circuit having a fourth exemplary die test structure with a support structure underlying a conductive bump in accordance with various embodiments of the present invention.

Whatever die test structure configuration is used, a selected embodiment of the present invention provides a test pad guard structure or ring around the die test structure to protect the die from any fracture damage caused during a bump shear test. An example embodiment is illustrated in FIG. 4, which shows in cross-sectional form one or more guard structures 80, 90 disposed around a die test structure 14. By positioning the guard structure(s) 80, 90, outside of the force region 78, the die is protected. In the depicted embodiment, the guard structures 80, 90 encircle or surround a test bump structure 505, 506 and a support structure 44 in which any predetermined pattern of metal lines 10 may be formed.

In the cross-sectional view of FIG. 4, the guard structure includes metal lines 81, 91 formed in the LM layer 71; vias 82, 92 formed in the LILD layer 72; metal lines 83, 93 formed in the LM-1 layer 73; vias 84, 94 formed in the LILD-1 layer 74; metal lines 85, 95 formed in the LM-2 layer 75; vias 86, 96 formed in the LILD-2 layer 76; and metal lines 87, 97 formed in the LM-3 layer 77. As will be appreciated, additional or fewer metal lines and vias may be used to form the guard structure. And while any strong, fracture-resistant material may be used to form the constituent guard structure layers, in a selected embodiment, the metal lines and vias are formed with copper, except for the bottom via which is formed as a tungsten plug to contact a silicon well region in the substrate (not shown).

Although not required for purpose of a test structure, vias between metal layers (LM, LM-1, LM-2, . . . ) can be placed in the underlying support structure 44 to connect the metal lines to the substrate 102 for purposes of avoiding electrical discharging during subsequent processing. Alternatively, contact to the substrate 102 could be made by connecting one end of the metal lines to the guard structure that connects to the substrate 102. In the case of electrical connection to ground or substrate, it is recommended that the vias be placed at an edge of the support structure 44. If placement of vias within support structure 44 is done, the increase in the complexity of the structure increases the complexity of identifying a failure mode. In practice, few functional devices have via metal densities greater than 20%, and therefore the dielectric and metal properties dominate the robustness of the area under a bond pad. Consequently, a structure with no vias may be the most straight forward way to identify a good die from a bad die.

Figure 5:
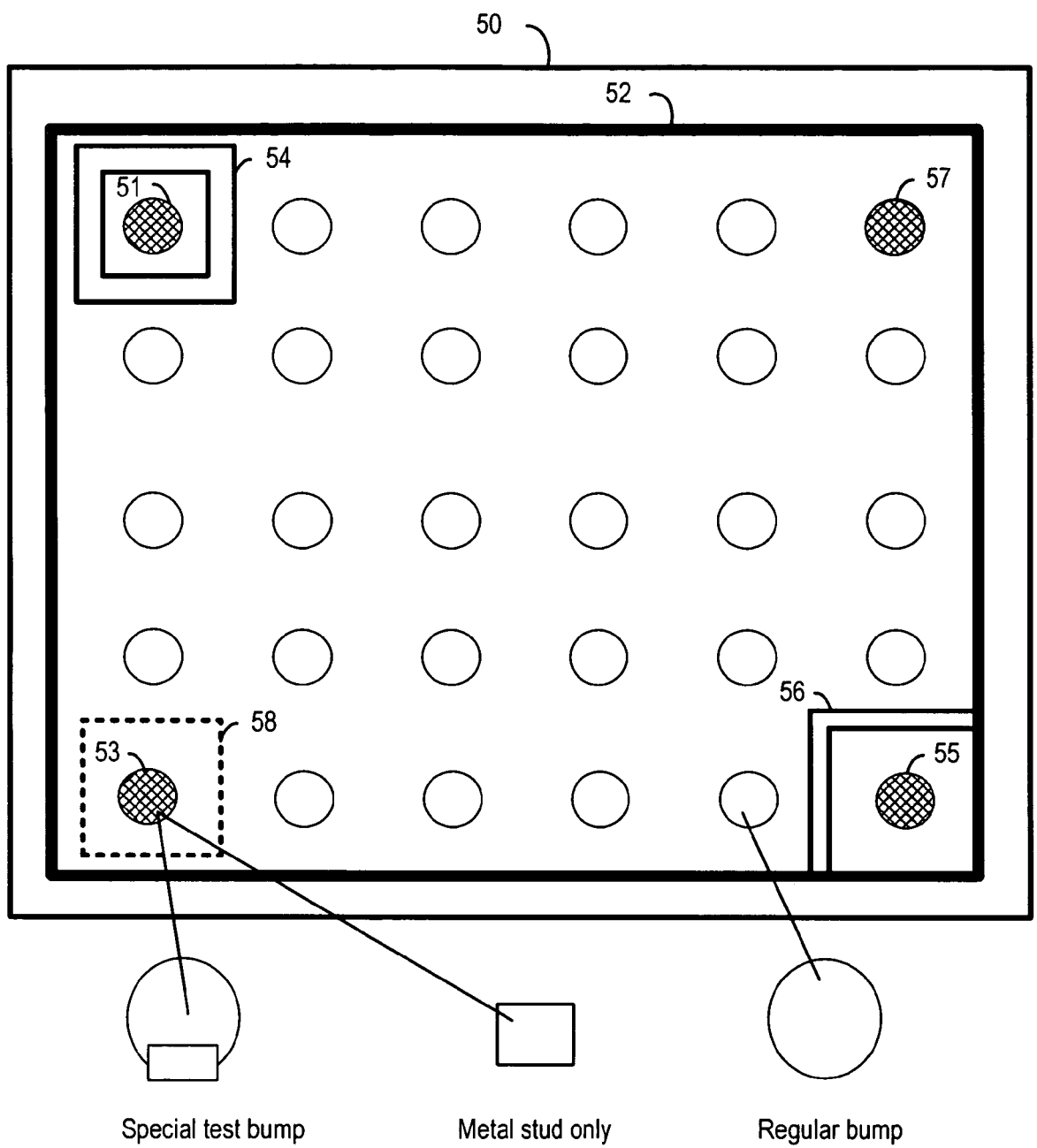
FIG. 5 illustrates a top plan view of a functional die in which one or more mechanical test features have incorporated in accordance with various embodiments of the present invention.

The dedicated die test structure disclosed herein may advantageously be incorporated at any desired location on a wafer, including on a functional die or a wafer die scribe, street or any desired location on the wafer, even if there is no functional integrated circuitry at that location. For example, rather than using active contact bumps for bump shear testing, the die test structures of the present invention may be used as dedicated test bump locations on a functional die to provide a mechanical test feature for each die. This is illustrated in FIG. 5, which shows a top plan view of a functional die 50 in which one or more embodiments of a die test structure have been incorporated in accordance with various embodiments of the present invention. For example, one or more special dummy or test bumps 51, 53, 55, 57 with stiff metal studs (or metal stud only) are placed on the die 50 in specific locations (e.g., the corners). While the support structures for each test bump (or stud) may have an identical, predetermined metal line pattern, the support structures can also be different for different dummy bumps (or studs). In addition, the test bumps may be located outside of the functional die circuitry.

When one or more test bumps (or studs) are placed on a die, the placement of each test bump may be determined with reference to the force region for that test bump. For example, a stress boundary 58 for a first test bump 53 defines the force region for that test bump, and is used to place the test bump 53 away from any other circuitry in the die 50 so that any mechanical fracture caused by a bump shear test of the test bump 53 does not affect the remainder of the die circuitry. In addition or in the alternative, a guard structure or ring may be used to physically isolate the test bumps. While an independent guard ring (e.g., guard ring 54) may be formed around a test bump (e.g., test bump 51), the die protection function may also be achieved by tying a guard structure 56 to an existing fracture-prevention structure in the die, such as the moisture/metal diffusion barrier 52 formed about the periphery of the die 50. This implementation is illustrated at test bump 55, where the guard structure 56, in combination with the edge seal 52 (which acts as a diffusion barrier and crack stop), protects the remainder of the die from any mechanical fracture induced during bump shear testing of the test bump 55.

When more than one die test structure is included on a die or a wafer, the number of variance tests per die or wafer may be increased. In a selected embodiment, between one and four die test structures are included on each die for use in performing in-line integrity monitoring. By providing each die test structure with a different support structure that is designed to approximate a different interconnect region on the die, the bump shear tests may effectively evaluate the mechanical integrity of the different interconnect regions. As an example, the four corner die test structures on each die can thus serve as the equivalent of several hundred conventional die tests that use die pull or other full die test techniques.

Figure 6:
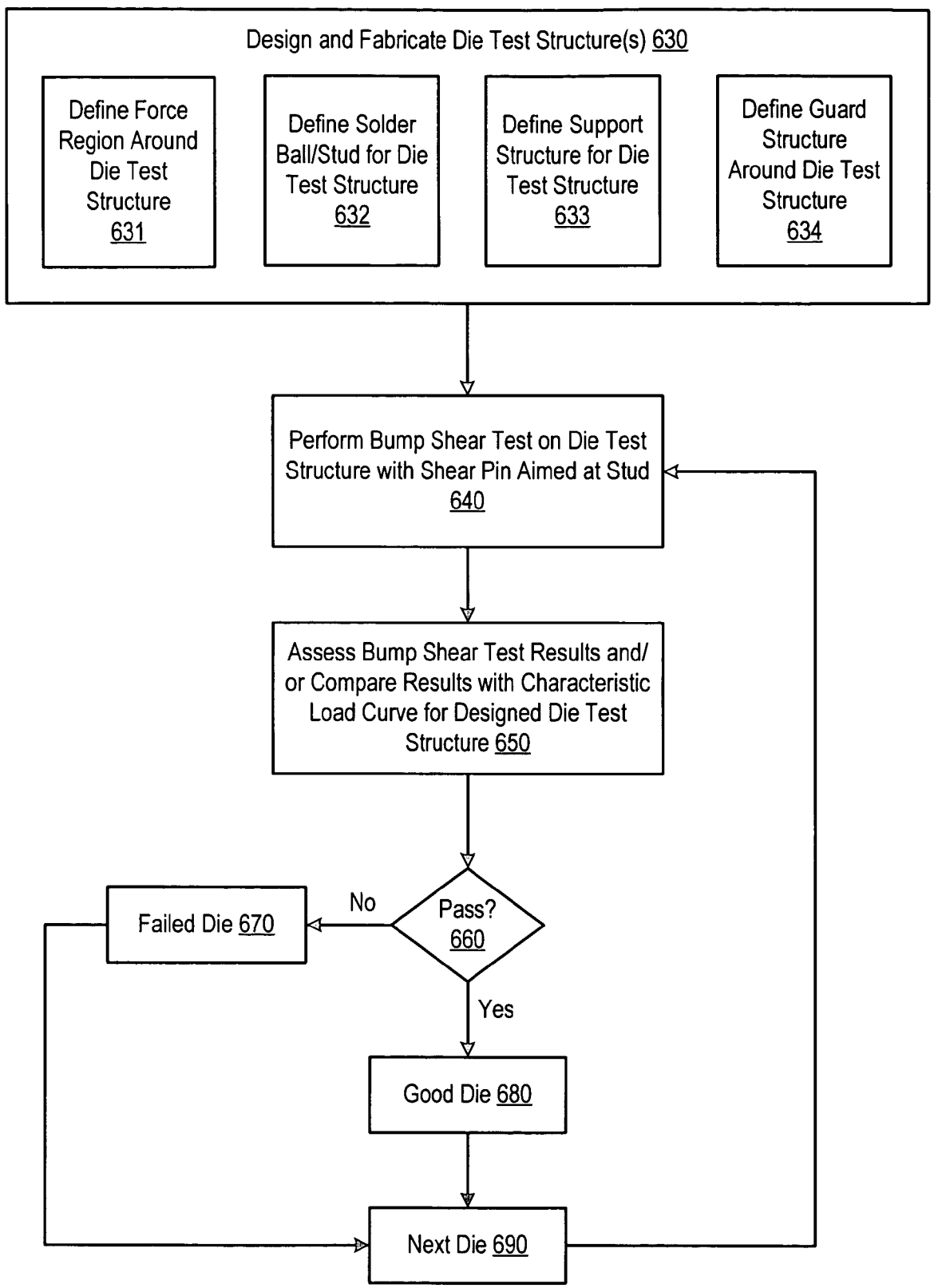
FIG. 6 illustrates in flow chart form an exemplary method for testing the mechanical integrity of one or more wafer die using the bump shear technique in accordance with various embodiments of the present invention.

Whether used to evaluate wafers, wafer die, or different locations on a wafer die, the mechanical integrity test methodology of the present invention provides a way to distinguish dielectric material differences, to detect structure differences and to find interface or interconnect weaknesses at the bond pad scale of a die. FIG. 6 illustrates in flow chart form an example method for testing the mechanical integrity of one or more wafer die using the bump shear technique, die test structure and support structure as variously described herein. Though selected embodiments of the mechanical integrity test methodology are illustrated in FIG. 6, it will be appreciated by those of ordinary skill in the art that the sequence of illustrated steps may be modified, reduced or augmented in keeping with the disclosure of the present invention. For example, any one or more of the steps may optionally be included or excluded. Thus, it will be appreciated that the methodology of the present invention may be thought of as performing the identified sequence of steps in the order depicted in FIG. 6, though the steps may also be performed in parallel, in a different order, or as independent operations that are combined.

The description of the illustrative methodologies for performing bump shear testing with a stiff die test structure can begin at step 630, where the die test structure is designed for fabrication on one or more die. The design step 630 may include specifying one or more design parameters, such as defining a force region 631, specifying a solder ball/stud structure 632, defining a metallization pattern for the interconnect layers in the support structure 633 and/or defining a guard structure or ring for the die test structure 634. In an example embodiment, the die test structure is defined to include a copper stud (with a diameter of 80 μm and a height of at least 5 μm) formed over a copper bond pad (75 μm×75 μm) with an orthogonal-type support structure in one or more of the interconnect layers.

Once a die test structure is fabricated in a die, a bump shear test may be performed on the die test structure (step 640). In order to obtain meaningful results, the shear knife should be positioned to intersect with the stiff structural component of the die test structure. In other words, the shear knife should be aimed at the stud. In this way, the mechanical integrity of the underlying support layers may be evaluated since this approach applies the lateral force from the shear knife to the support layers instead of primarily impacting only the softer solder ball material.

In accordance with various embodiments of the present invention, the bump shear test on the die test structure may be performed on the wafer prior to singulation of the wafer into individual die and prior to encapsulation or packaging. In addition, the bump shear test may be performed on a test structure located on a "dummy" die that has no functioning integrated circuitry, thereby providing data on the mechanical integrity of the stack on the dummy die which would be representative of functional die. Similarly, the bump shear test may be performed on a test structure that is located in a scribe area of a wafer, thereby providing test results without sacrificing functioning die.

Next, the bump shear test results are assessed at step 650. This may be done with a visual inspection of the die test structure to see which layers were fractured by the bump shear test. For example, if only the solder ball and/or copper stud are removed or sheared by the test, then the underlying support structures have the desired mechanical integrity, and the die passes 680 (affirmative outcome to decision 660). However, if any part of the underlying support structure (or even the copper bond pad or metal cap layer) is fractured by the bump shear test, then the underlying support structures does not have the desired mechanical integrity, and the die fails 670 (negative outcome to decision 660). The bump shear test may the performed on the next die (step 690).

The bump shear test results may also be assessed at step 650 by comparing the bump shear test results with the load curve and maximum load recorded in a database of bump shear measurements to qualitatively characterize the material properties of the underlying support layers, which may be formed from low-k materials. If the test result passes the comparison analysis (affirmative outcome to decision 660), then the die passes 680. Otherwise (negative outcome to decision 660), the die fails 670.

By now it should be appreciated that there has been provided a bump shear technique, die test structure and predetermined support structure for providing structural support during bump shear test operations. In one form, there is provided herein a bump shear test for evaluating the mechanical integrity of interconnect layers in an integrated circuit for mechanical integrity. First, an integrated circuit having a die test structure is mounted on a test device. As fabricated, the die test structure includes a stiff structural component positioned above and affixed to a conductive metal pad formed in a last metal layer. In various embodiments, the die test structure is formed as a solder ball formed with a high modulus material (such as lead-free solder), as a solder ball containing a high modulus stud, or as a stud formed with a high modulus material such as copper, tantalum, tungsten or chromium. In addition, the die test structure may include a dedicated support structure that is formed with a plurality of low-k dielectric layers in a force region below the conductive metal pad. The support structure may be formed as a predetermined pattern (e.g., parallel, orthogonal or random) of metal lines formed in one or more interconnect layers in the integrated circuit. The integrated circuit may also include a guard structure disposed in the interconnect layers and outside of a force region to protect the integrated circuit from any fractures in the die test structure. By positioning and laterally moving the shear knife laterally in relation to the integrated circuit, the shear knife contacts the stiff structural component. Any resulting damage to the die test structure caused by the lateral movement of the shear knife is assessed to evaluate the mechanical integrity of the interconnect layers.

In another form, a testing method is provided for measuring the mechanical integrity of an integrated circuit formed with a low-k interconnect stack. First, an integrated circuit is fabricated with a die test structure that includes a stiff structural component affixed over a conductive metal pad formed in an upper layer of the low-k interconnect stack. As fabricated, the stiff structural component may be formed as a solder bump and an internal stud structure formed of a stiff material, as a stud structure alone or as a solder bump formed of a high modulus material. In addition, the die test structure may include a dedicated support structure formed with a predetermined layout pattern of metallization and dielectric in the interconnect stack underlying and affixed to the conductive metal pad. After fabricating the integrated circuit, a bump shear test is performed on the die test structure by aiming a shear knife at the stiff structural component. The mechanical integrity of the integrated circuit is then assessed to determine whether the integrated circuit passes the bump shear test. If only the stiff structural component is removed or sheared by the test, then the underlying support structures in the integrated circuit have the desired mechanical integrity, and the die passes. However, if any part of the underlying support structure is fractured by the bump shear test, then the underlying support structures does not have the desired mechanical integrity, and the die fails.

In yet another form, an integrated circuit structure and fabrication method is provided for forming a die test structure over a substrate. First, a low-k interconnect stack is formed over the substrate, where the low-k interconnect stack includes a dedicated support structure having a predetermined pattern of metal lines in a plurality of interconnect layers. A bond pad is then formed in a last metal layer of the low-k interconnect stack, and one or more under bump metallization layers formed over and attached to the bond pad. Finally, a copper stud is formed over and attached to the under bump metallization layer, where the height of the copper stud is selected to contact a shear knife during a bump shear test. The die test structure may also include a test pad guard structure formed around at least part of the die test structure to protect the integrated circuit from any fracture damage caused during a bump shear test.

Those skilled in semiconductor fabrication will appreciate that additional, conventional processing steps (not depicted) are performed as part of the fabrication of each die. As examples, transistors may be formed with various gate electrode formation, extension implant, halo implant, spacer formation, and source/drain implant steps may be performed to complete the transistors. In addition, conventional backend processing (not depicted) typically including multiple levels of interconnect is then required to connect the transistors in a desired manner to achieve the desired functionality.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A bump shear testing method for evaluating a semiconductor structure for mechanical integrity, comprising:
   providing a semiconductor structure, said semiconductor structure comprising a die test structure having a stiff structural component positioned above and affixed to a conductive metal pad formed in a last metal layer and a dedicated test support structure underlying the conductive metal pad;
   moving the shear knife laterally in relation to the semiconductor structure to cause the shear knife to contact the stiff structural component during lateral movement of the shear knife; and
   assessing any damage to the die test structure caused by the lateral movement of the shear knife to evaluate the mechanical integrity of one or more interconnect layers in the dedicated test support structure of the semiconductor structure.

2. The bump shear testing method of claim 1, where the die test structure having a stiff structural component comprises a copper stud in a solder ball.

3. The bump shear testing method of claim 1, where the die test structure having a stiff structural component comprises a stud formed with a high modulus material selected from the group comprising copper, tantalum, tungsten or chromium.

4. The bump shear testing method of claim 1, where the die test structure having a stiff structural component comprises a solder ball formed with a high modulus lead-free solder material.

5. The bump shear testing method of claim 1, where the dedicated test support structure comprises a predetermined pattern of metal lines formed in one or more interconnect layers in the semiconductor structure.

6. The bump shear testing method of claim 5, where the dedicated test support structure further comprises a plurality of low-k dielectric layers.

7. The bump shear testing method of claim 5, where the predetermined pattern of metal lines comprises a parallel-type pattern of metal lines.

8. The bump shear testing method of claim 5, where the predetermined pattern of metal lines comprises an orthogonal-type pattern of metal lines.

9. The bump shear testing method of claim 5, where the predetermined pattern of metal lines comprises a random-type pattern of metal lines.

10. The bump shear testing method of claim 1, where the semiconductor structure comprises a guard structure disposed in the interconnect layers and outside of a force region to protect the semiconductor structure from any fractures in the die test structure.

11. A method of testing a mechanical integrity measure of a low-k interconnect stack, the method comprising:
    fabricating a semiconductor structure with a test structure comprising:
       a stiff structural component affixed over a conductive metal pad formed in an upper layer of a low-k interconnect stack, and
       a dedicated support structure below the conductive metal pad comprising a predetermined pattern of metal lines formed in the low-k interconnect stack;
    performing a bump shear test on the test structure by aiming a shear knife at the stiff structural component; and
    assessing a mechanical integrity measure for the low-k interconnect stack by determining whether the low-k interconnect stack passes the bump shear test.

12. The method of claim 11, where the stiff structural component comprises a solder bump and an internal stud structure.

13. The method of claim 11, where the stiff structural component comprises a stud structure.

14. The method of claim 13, where the stud structure is formed of a stiff material selected from the group comprising copper, tantalum, tungsten or chromium.

15. The method of claim 11, where the stiff structural component comprises a solder bump formed of a high modulus lead-free solder material.

16. The method of claim 11, where the predetermined pattern of metal lines is affixed to the conductive metal pad.

17. The method of claim 16, where the predetermined layout pattern of metallization and dielectric comprises a parallel-type pattern of metal lines, a perpendicular-type pattern of metal lines or a random-type pattern of metal lines.

* * * * *